United States Patent
Shubert

(10) Patent No.: US 7,784,668 B2
(45) Date of Patent: Aug. 31, 2010

(54) REPAIR METHOD FOR PROPAGATING EPITAXIAL CRYSTALLINE STRUCTURES BY HEATING TO WITHIN 0-100° F OF THE SOLIDUS

(75) Inventor: Gary Charles Shubert, East Hampton, CT (US)

(73) Assignee: United Technologies Corporation, Hartford, CT (US)

( * ) Notice: Subject to any disclaimer, the term of this patent is extended or adjusted under 35 U.S.C. 154(b) by 568 days.

(21) Appl. No.: 11/303,624

(22) Filed: Dec. 16, 2005

(65) Prior Publication Data

US 2007/0138238 A1   Jun. 21, 2007

(51) Int. Cl.
  *B23K 31/00* (2006.01)
  *B23K 28/00* (2006.01)
  *B23K 35/12* (2006.01)
  *B23K 1/19* (2006.01)

(52) U.S. Cl. .................. 228/119; 228/200; 228/245; 228/262.1; 29/889.1; 219/121.64

(58) Field of Classification Search ............. 228/119, 228/196, 197, 200, 223.2, 234.1, 245–262; 29/889.1, 889.7–889.722; 219/121.6, 121.61, 219/121.63, 121.64, 136, 137 R, 162, 603, 219/617

See application file for complete search history.

(56) References Cited

U.S. PATENT DOCUMENTS

| | | | | |
|---|---|---|---|---|
| 3,552,898 A * | 1/1971 | Bird et al. | ................... | 228/193 |
| 3,655,458 A * | 4/1972 | Reichman | .................... | 419/15 |
| 4,270,594 A * | 6/1981 | Chumakov | .................. | 164/127 |
| 4,663,513 A * | 5/1987 | Webber | .................... | 219/121.6 |
| 5,048,183 A * | 9/1991 | Cang et al. | ................. | 29/889.1 |
| 5,261,480 A * | 11/1993 | Wortmann et al. | .......... | 164/256 |
| 5,304,039 A * | 4/1994 | Corderman et al. | ..... | 416/241 R |
| 5,673,745 A * | 10/1997 | Jackson et al. | ................ | 164/80 |
| 5,743,322 A | 4/1998 | Jackson et al. | | |
| 5,897,801 A * | 4/1999 | Smashey et al. | .... | 219/137 WM |
| 6,024,792 A * | 2/2000 | Kurz et al. | ...................... | 117/9 |
| 6,084,196 A * | 7/2000 | Flowers et al. | ......... | 219/121.46 |
| 6,193,141 B1 * | 2/2001 | Burke et al. | ................ | 228/190 |
| 6,520,401 B1 * | 2/2003 | Miglietti | ..................... | 228/194 |
| 6,814,544 B2 * | 11/2004 | Tsukamoto et al. | ....... | 416/96 R |
| 7,008,522 B2 * | 3/2006 | Boucard et al. | ............. | 205/115 |
| 7,306,670 B2 | 12/2007 | Beck et al. | | |
| 2003/0034379 A1 * | 2/2003 | Jackson et al. | ............. | 228/119 |
| 2003/0143074 A1 * | 7/2003 | Tsukamoto et al. | ....... | 416/96 R |
| 2003/0145977 A1 * | 8/2003 | Smashey | .................... | 164/462 |
| 2004/0112280 A1 * | 6/2004 | Beck et al. | .................... | 117/84 |
| 2005/0067065 A1 * | 3/2005 | Fernihough et al. | ......... | 148/512 |
| 2005/0067466 A1 * | 3/2005 | Boegli et al. | ................ | 228/119 |
| 2006/0225641 A1 * | 10/2006 | Bostanjoglo et al. | .......... | 117/84 |

FOREIGN PATENT DOCUMENTS

| | | |
|---|---|---|
| EP | 0 581 547 | 2/1994 |
| EP | 0 815 993 | 1/1998 |
| EP | 1 340 567 | 9/2003 |
| JP | 10080748 A | 3/1998 |
| JP | 2003 048053 | 2/2003 |
| WO | 03087439 A1 | 10/2003 |

\* cited by examiner

*Primary Examiner*—Jessica L Ward
*Assistant Examiner*—Carlos Gamino
(74) *Attorney, Agent, or Firm*—Bachman & LaPointe, P.C.

(57) ABSTRACT

A repair method of propagating epitaxial crystalline structures is provided. The repair method broadly comprises the steps of providing a substrate to be repaired, placing an additive material as a preformed shape onto an area of the substrate to be repaired, utilizing a heat source to heat an entire volume of the additive material and an area adjacent to the additive material to within 0-100° F. of their solidus temperatures, holding at the fusion temperature for a time sufficient to allow grain growth and orientation to occur, and ramping down the heat source at a predetermined controlled rate until solidification is complete.

22 Claims, No Drawings

REPAIR METHOD FOR PROPAGATING EPITAXIAL CRYSTALLINE STRUCTURES BY HEATING TO WITHIN 0-100° F OF THE SOLIDUS

BACKGROUND OF THE INVENTION (1) Field of the Invention

The present invention relates to a method for repairing a workpiece, such as a turbine engine component, and more particularly, to a repair method where a desired crystalline structure is initiated from the parent material through an additive layer.

(2) Prior Art

Depositing repair material onto directionally solidified (DS) or single crystal (SC) substrates and fusing this material, i.e. welding, without creating high angle grain boundaries is difficult. This is due to several factors including (1) the inability to control the rate of heating; (2) the inability to control time at temperature; and (3) the inability to control the cooling rate across the entire surface. For example, when the heating source (point source), which is directly influencing the material, is moved across a surface of the substrate being repaired, there is an effect of moving or flowing the heat generated to an area adjacent to the source. As a result of the heat source movement, the area trailing the source begins to cool. It is the control and balancing of the dynamic heating, cooling and time at temperature cycles that have been the focus of development efforts in the past.

In addition to the difficulties associated with the motion of the heat source, starting and stopping of the motion and heat source power have aggravated the thermal cycle. Still further, heat flow difficulties have been additionally complicated by difficulties associated with the variable geometries and thicknesses of the material substrates.

Thus, there is needed a repair technique which effectively eliminates or deals with these difficulties.

SUMMARY OF THE INVENTION

Accordingly, it is an object of the present invention to provide a repair method which creates thermal profiles favorable to the formation of directionally solidified and single crystal structures near the repair or additive material/substrate interface and which allow these structures to be continued through or grown into the repair material.

It is a further object of the present invention to provide a repair method as above which is relatively low cost when compared to other techniques.

The foregoing objects are attained by the repair method of the present invention.

In accordance with the present invention, a repair method for propagating epitaxial crystalline structures is provided. The repair method broadly comprises the steps of providing a substrate to be repaired, placing an additive material as a preformed shape onto an area of the substrate to be repaired, utilizing a heat source to heat an entire volume of the additive material and an area adjacent to the additive material to a fusion temperature, holding at the fusion temperature for a time sufficient to allow grain growth and orientation to occur, and ramping down the heat source at a predetermined controlled rate until solidification is complete.

Other details of the repair method for propagating epitaxial crystalline structures of the present invention, as well as other objects and advantages attendant thereto are set forth in the following detailed description.

DETAILED DESCRIPTION OF THE PREFERRED EMBODIMENT(S)

The present invention has to do with the repair of workpieces, in particular turbine engine components. For example, the method of the present invention may be used to repair or build up a platform of a turbine blade. The repair method of the present invention may be used to repair a wide variety of turbine engine components having substrates formed from a base metal material, such as a nickel based alloy, having either a directionally solidified or single crystal structure. Examples of such alloys include DSR 142 and Mar-M-247DS. The substrate may be formed from a nickel based gamma prime strengthened alloy.

Prior to beginning the repair, the crystallographic orientation in the repair area is determined. This can be done using any suitable technique known in the art including, but not limited to, X-ray diffraction, Laue Back Reflection, and Optical Orientation techniques. It is preferred to have the crystals oriented such that they are perpendicular to the surface to be repaired; however, angles up to +/−15 degrees from perpendicular can be accommodated.

Further, prior to beginning the repair, the substrate material is cleaned to remove oxides, contaminants, and other deleterious materials by a cleaning technique which is determined by the type of substrate material and the oxides, contaminants, and other materials to be removed. Thus, any suitable cleaning technique known in the art may be used to first clean the substrate and, in particular, the area to be repaired and areas adjacent thereto.

After the cleaning operation has been completed, an additive or repair material may be placed over the area to be repaired or built up. As used herein, the term "repair" also includes building up an area of the workpiece. The additive or repair material may comprise a material having a composition which is the same as, or which is similar to, the composition of the workpiece. The additive or repair material may be pre-placed as a preformed shape. The workpiece should be positioned so that a layer of additive or repair material is placed on top of the workpiece so as to minimize the effect of gravity and so that the additive or repair material layer does not run off as easily. For example, the shape could be a sintered shape, wire, sheet, or casting of suitable directionally solidified or single crystal type material.

After the additive or repair material has been placed, the substrate with the additive or repair material in place is subjected to heating using a heat source, which is capable of heating the entire volume of the additive or repair material and the areas adjacent to the additive material (the fusion and dilution zones). The substrate and the repair or additive material are heated to a fusion temperature which is within +100 degrees Fahrenheit to 0 degrees Fahrenheit of the solidus temperatures. Typically, for nickel based alloys of the type discussed herein, the temperature is in the range of from about 2400 to 2600 degrees Fahrenheit for nickel based superalloy. This allows the additive material to be joined to the substrate material. The substrate and the additive material are held at the fusion temperature for a time sufficient to allow coalescence and consolidation of the additive layer and the substrate to occur, while at the same time, grain growth and orientation within the additive layer occurs. The heating source is then removed and cooling is allowed to take place at an essentially uniform rate. Typically, the larger mass of the substrate and the large heat sink provided by the substrate provide directional cooling by conduction and assist in the preferential orientation of the grain structure in the additive layer to that of the substrate. After joining, the substrate and the additive layer assembly are subjected to traditional stress relief cycles appropriate for the material.

The heat source for the heating operation is preferably a uniform controlled heat source which would heat the entire area to be repaired or built up. The heat source could be similar to heat sources utilized for melting or crystal orientation in original casting operations for the base metal material and/or the repair/additive material. For example, the heating source could be, but is not limited to, an induction heating source, a plasma or other arc process source, or an electron beam or laser source being operated to provide essentially uniform heating of the additive layer and substrate by some form of rastering of scanning of the beam.

During the heating operation, the substrate and the repair/additive material are preferably maintained in an appropriate non-reactive atmosphere, such as an inert gas atmosphere or a vacuum.

After the heating operation, the heat source is ramped down at a predetermined controlled rate until solidification is complete. Dependent upon the desired geometry of the additive material, fluidity, and surface tension of the additive material, the composition of the base material, the composition of the additive material, and the thickness of the additive layer, the ramp down of the temperature from the fusion temperature to the solidus temperature of the weld zone is conducted at such a rate as to allow the orientation of the grain boundaries of the additive layer to preferentially seed or orient to those of the base substrate. This cooling profile reduces the total number and the distribution of high angle grain boundaries to an amount and distribution similar to those of the substrate. The cooling rate being uniform throughout the entire volume of the additive layer allows for the orientation of the grain boundaries at the peripheries or ends of the additive material to develop essentially the same as those areas near the center locations of the additive layer. Additionally, the time at which these alloys are maintained at the temperature corresponding to the nil ductility range as described in U.S. Pat. No. 5,897,801, which is hereby incorporated by reference herein, should be as short as possible due to the tendency for the generation of cracking along any remaining high angle grain boundaries. By decaying or ramping down the heat source in this manner, favorable thermal profiles to the formation of directionally solidified or single crystal structures near the repair material/substrate base metal interface can be created. Further, the thermal profiles thus created can be such that the directionally solidified or single crystal structures thus initiated could be continued through or grown into the additive material.

The repair method of the present invention offers a number of advantages. First, it allows the repair or geometric restoration of directionally solidified and single crystal structure turbine engine components. It also allows a build up of structures on a directionally solidified or single crystal structure surface. It also allows the densification/fusion of thermal sprayed coatings and the rebuilding of components with a parent material or another material. The repair method of the present invention is advantageous in that it has a relative low cost when compared to laser, plasma or other powder deposition processes.

While the repair method of the present invention has been described broadly as placing the additive or repair material in a single step, for large masses of additive/repair material relative to the surface area of the substrate, the repair/additive material may be added in a series of steps. If necessary, one or more of these steps may utilize containers and/or molds to support the repair/additive material when in a molten state.

While the present invention has been described in the context of repair turbine engine components, the repair method of the present invention could be used to repair a wide variety of non-engine components which have a substrate formed from a metal base material that has either a directionally solidified or single crystal structure.

It is apparent that there has been provided in accordance with the present invention a repair method for propagating epitaxial crystalline structure which fully satisfies the objects, means, and advantages set forth hereinbefore. While the present invention has been described in the context of specific embodiments thereof, other alternatives, modifications, and variations will become apparent to those skilled in the art having read the foregoing description. Accordingly, it is hereby intended to embrace those alternatives, modifications, and variations as fall within the broad scope of the appended claims.

What is claimed is:

1. A method for repairing a workpiece comprising:
providing a substrate to be repaired;
pre-placing an additive material as a preformed shape onto an area of the substrate to be repaired;
initiating heating of said substrate only after said additive material has been pre-placed onto said substrate and utilizing a heat source to heat an entire volume of said additive material and an area adjacent to the additive material to a temperature within a range from +100° F. to 0° F. of solidus temperatures of said substrate and said additive material;
holding at said temperature for a time sufficient to allow coalescence and consolidation of the additive material and the substrate and grain growth and orientation within the additive material to occur at the same time; and
ramping down the heat source at a predetermined controlled rate until solidification is complete.

2. A repair method according to claim 1, wherein said ramping down step comprises ramping down the heat source from a solidification temperature through nil ductility at a rate which limits formation of cracks or tears within grain boundaries.

3. A repair method according to claim 1, wherein said additive material placing step comprises placing a sintered shape of said additive material.

4. A repair method according to claim 1, wherein said additive material placing step comprises placing said additive material in wire form onto the area to be repaired.

5. A repair method according to claim 1, wherein said additive material placing step comprises placing said additive material in sheet form onto the area to be repaired.

6. A repair method according to claim 1, wherein said additive material placing step comprises placing said additive material in a cast form onto the area to be repaired.

7. A repair method according to claim 1, wherein said additive material placing step comprises placing an additive material formed from a material capable of having a directionally solidified structure.

8. A repair method according to claim 1, wherein said additive material placing step comprises placing an additive material formed from a material capable of having a single crystal structure.

9. A repair method according to claim 1, wherein said substrate providing step comprises providing a turbine engine component having a base metal material with a directionally solidified structure.

10. A repair method according to claim 1, wherein said substrate providing step comprises providing a turbine engine component having a base metal material with a single crystal structure.

11. A repair method according to claim 1, wherein said heat source utilizing step comprises utilizing a uniform controlled heat source.

12. A repair method according to claim 1, wherein said temperature holding step comprises holding said temperature for a period sufficient to allow the formation of a directionally solidified structure near the additive material/substrate interface.

13. A repair method according to claim 1, wherein said temperature holding step comprises holding said temperature for a period sufficient to allow the formation of a single crystal structure near the additive material/substrate interface.

14. A repair method according to claim 1, further comprising maintaining the areas being heated in a non-reactive atmosphere during atmosphere during application of heat from said heat source.

15. A repair method according to claim 1, wherein said additive material pre-placing step comprises placing said additive material onto said area in a plurality of steps.

16. A repair method according to claim 1, wherein said additive material pre-placing step comprises placing said additive material onto said area and restricting flow of said additive material with a mold or a container.

17. A method for repairing a turbine engine component comprising the steps of:
   providing a substrate having a particular crystalline structure;
   placing an additive material over a portion of the substrate;
   initiating heating of said substrate only after said additive material has been placed onto said substrate and heating the additive material and an area adjacent to the additive material which includes both a fusion zone and a dilution zone to a temperature within a range of from +100° F. to 0° F. of solidus temperatures of said substrate and said additive material utilizing a heat source; and
   holding the temperature for a time sufficient to allow the formation of said particular crystalline structure to occur in an interface region between said additive material and said substrate and to continue into the additive material; and
   allowing said additive material and said substrate to solidify within said interface region.

18. A repair method according to claim 17, wherein said substrate has a directionally solidified crystalline structure and said temperature holding step comprises holding said temperature for a time sufficient to allow formation of a directionally solidified crystalline structure into said interface region and into said additive material.

19. A repair method according to claim 17, wherein said substrate has a single crystal crystalline structure and said temperature holding step comprises holding said temperature for a time sufficient to allow formation of a single crystal crystalline structure into said interface region and into said additive material.

20. A repair method according to claim 17, further comprising ramping down the heat source at a controlled rate ramp down until solidification is complete.

21. A method for repairing a workpiece according to claim 1, wherein said utilizing step comprises heating said entire volume of said additive material and said area adjacent to the additive material to a temperature in the range of from 2400° F. to 2600° F.

22. A repair method according to claim 17, wherein said heating step comprises heating said entire volume of said additive material and said area adjacent to the additive material to a temperature in the range of from 2400° F. to 2600° F.

* * * * *